(12) United States Patent
Kwak et al.

(10) Patent No.: US 9,063,867 B2
(45) Date of Patent: Jun. 23, 2015

(54) METHOD AND APPARATUS FOR ADAPTIVE GRAVITY SEARCH

(75) Inventors: Byung-Jae Kwak, Seoul (KR);
Bum-Soo Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 649 days.

(21) Appl. No.: 13/335,693

(22) Filed: Dec. 22, 2011

(65) Prior Publication Data

US 2012/0166159 A1    Jun. 28, 2012

(30) Foreign Application Priority Data

Dec. 23, 2010   (KR) .......................... 10-2010-0133789
Sep. 6, 2011   (KR) .......................... 10-2011-0090383

(51) Int. Cl.
*G06F 17/10*        (2006.01)
*H03H 21/00*       (2006.01)
*G05B 17/02*       (2006.01)

(52) U.S. Cl.
CPC ............ *G06F 17/10* (2013.01); *H03H 21/0043* (2013.01); *H03H 21/0012* (2013.01); *H03H 2021/0089* (2013.01); *G05B 17/02* (2013.01)

(58) Field of Classification Search
None
See application file for complete search history.

(56) References Cited

PUBLICATIONS

Mathews et al., "Adaptive Filters", Chapter 4, 2003, 48 pages, http://www.ece.utah.edu/~mathews/ece6550/chapter4.pdf.*
Dornean et al., "System Identification with Least Mean Square Adaptive Algorithm" Interdisciplinarity in Engineering Scientific International Conference, Nov. 2007, 4 pages.*
S. Haykin et al., "Least-Mean-Square Adaptive Filters", 2003, John Wiley & Sons Inc.

* cited by examiner

*Primary Examiner* — Omar Fernandez Rivas
*Assistant Examiner* — Herng-Der Day

(57) ABSTRACT

Provided are a gravity search adaptive apparatus and method. The gravity search adaptive apparatus includes: a system configured to process and output a received signal; a system modeling unit configured to receive the same signal as a signal input to the system, to convert the signal using a system modeling parameter, and to output the converted signal; and an adaptive controller configured to use a gravity search adaptive algorithm to detect the system modeling parameter so that an error signal which is a difference between an output signal of the system and an output signal of the system modeling unit converges on a minimum value when the system modeling parameter is applied to the system modeling unit.

17 Claims, 15 Drawing Sheets

METHOD AND APPARATUS FOR ADAPTIVE GRAVITY SEARCH

CROSS-REFERENCE TO RELATED APPLICATION

This application claims the benefit under 35 U.S.C. §119 (a) of Korean Patent Applications No. 10-2010-0133789, filed on Dec. 23, 2010, and No. 10-2011-0090383, filed on Sep. 6, 2011, the entire disclosures of which are incorporated herein by reference for all purposes.

BACKGROUND

1. Field

The following description relates to system modeling, and more particularly, to an apparatus and method for adaptively modeling a system by estimating system model parameters using statistical characteristics of signals.

2. Description of the Related Art

A signal processing system needs an algorithm for optimizing itself under a predetermined criterion upon signal processing when no information about a certain input signal is given, in order to vary system characteristics as necessary. Such an algorithm is called an adaptive algorithm.

A representative adaptive algorithm is a steepest descent algorithm. However, the steepest descent algorithm has a problem that it is not easy to adjust a convergence speed.

SUMMARY

The following description relates to an apparatus and method for adaptive gravity search, capable of easily adjusting a convergence speed and a convergence pattern.

In one general aspect, there is provided a gravity search adaptive apparatus for modeling a system, including: a system modeling unit configured to receive the same signal as a signal input to the system, to convert the signal using a system modeling parameter, and to output the converted signal; and an adaptive controller configured to use a gravity search adaptive algorithm to detect the system modeling parameter so that an error signal which is a difference between an output signal of the system and an output signal of the system modeling unit converges on a minimum value.

In another general aspect, there is provided a gravity search adaptive method including: calculating a system modeling parameter of a system modeling unit for minimizing an error signal which is a difference between an output signal of a system and an output signal of the system modeling unit when the same signal has been input to the system and the system modeling unit; and applying the system modeling parameter to the system modeling unit.

Other features and aspects will be apparent from the following detailed description, the drawings, and the claims.

Figure 1:
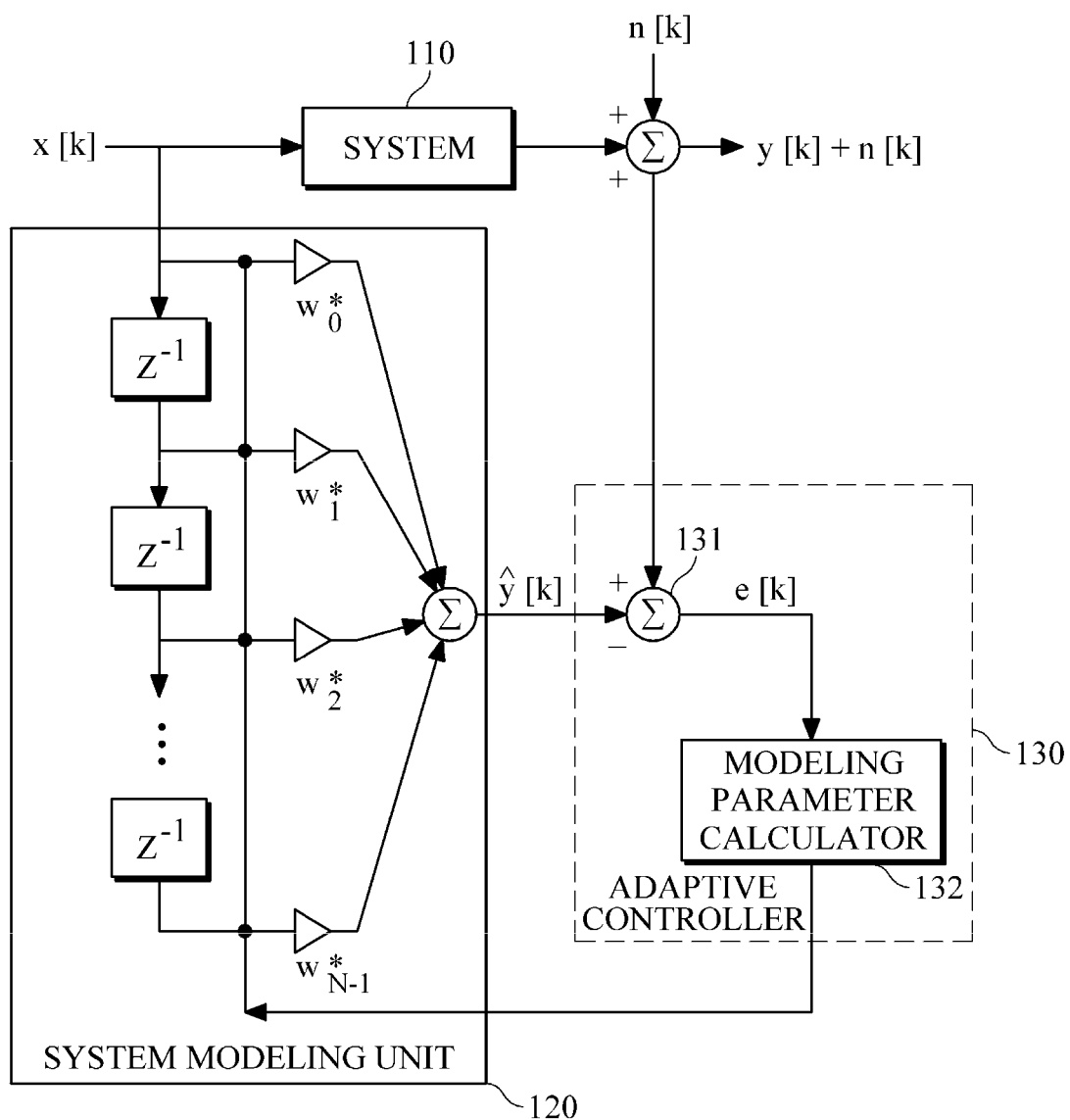
FIG. 1 is a diagram illustrating a configuration example of a system modeling apparatus for implementing a general adaptive algorithm.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating a configuration example of a system modeling apparatus for implementing a general adaptive algorithm.

Referring to FIG. 1, the system modeling apparatus includes a system 110, a system modeling unit 120, and an adaptive controller 130.

The system 110 processes and outputs input signals. The processing characteristics of the system 110 are not known or changes in time depend on environmental factors.

In FIG. 1, x[k] represents an input signal of the system 110, which is a (N×1) vector, and y[k] represents an output signal from the system 110.

The system modeling unit 120 has been modeled as mathematical representation of the system 110. The system modeling unit 120 is used to model a unknown system or a system whose characteristics vary depending on environmental factors. $\vec{w}[k]$, which is an (N×1) vector, represents a parameter vector of the system modeling unit 120. The system modeling unit 120 receives the input signal x[k] of the system 110 and applies $\vec{w}[k]$ to the input signal x[k], thus outputting an output signal ŷ[k].

The adaptive controller 130 controls the system 110 and the system modeling unit 120 so that the same signal is applied to the system 110 and the system modeling unit 120, and compares an output signal from the system 110 to an output signal from the system modeling unit 120 to thereby estimate a parameter of the system modeling unit 120. In detail, the adaptive controller 130 includes an error detector 131 and a modeling parameter calculator 132.

The error detector 131 detects a difference between the output signal y[k] of the system 110 and the output signal ŷ[k] of the system modeling unit 120, thus outputting the detected difference as an error signal e[k]. Then, the modeling parameter calculator 132 calculates a modeling parameter vector for reducing power of the error signal e[k] output from the error detector 131, and applies the modeling parameter vector to the system modeling unit 120. Then, the modeling parameter calculator 132 continues to calculate modeling parameters until the error signal e[k] between the output signal y[k] of the system 110 and the output signal ŷ[k] of the system modeling unit 120 obtained when the previously calculated modeling parameter is applied to the system modeling unit 120 converges on a minimum value, and supplies the calculated modeling parameters to the system modeling unit 120 to thereby update the system modeling unit 120.

That is, the adaptive controller 130 estimates a system modeling parameter for approximating the output value of the system modeling unit 120 to the output value y[k] of the system 110, thereby estimating the characteristics of the system 110.

The output signal ŷ[k] of the system modeling unit 120 at time k is expressed by equation 1 below.

$$\hat{y}[k] = \sum_{n=0}^{N-1} w_k^*[k] \cdot x[k-n] = \vec{w}[k]^H \vec{x}[k] \quad (1)$$

In equation 1, H represents Hermitian Transpose, and (N×1) vectors $\vec{w}[k]$ and $\vec{x}[k]$ are defined as follows.

$$\vec{w}[k] = \begin{bmatrix} w_0[k] \\ w_1[k] \\ \vdots \\ w_{N-1}[k] \end{bmatrix}, \quad \vec{x}[k] = \begin{bmatrix} x[k] \\ x[k-1] \\ \vdots \\ x[k-N+1] \end{bmatrix}$$

An adaptive algorithm is aimed at obtaining a modeling parameter vector for minimizing the power of an error signal which is a difference between the output signal of a real system and the output signal of a system modeling unit.

When noise n[k] exists in a measured signal, the error signal e[k] can be expressed by equation 2 below.

$$e[k] = y[k] - \hat{y}[k] + n[k] \quad (2)$$

Also, the power $\epsilon$ of the error signal e[k] is given as equation 3 below.

$$\varepsilon = E\{|e[k]|^2\} = E\{e[k]e^*[k]\} \quad (3)$$
$$= E\{|y[k]|^2 - y[k]\vec{x}[k]^H \vec{w}[k] - \vec{w}[k]^H \vec{x}[k]y^*[k] +$$
$$\vec{w}[k]^H \vec{x}[k]\vec{x}[k]^H \vec{w}[k] + y[k]n^*[k] + n[k]y^*[k] -$$
$$\vec{w}[k]^H \vec{x}[k]n^*[k] - n[k]\vec{x}[k]^H \vec{w}[k] + n^*[k]n[k]\}$$
$$= \sigma_y^2 - \vec{p}^H \vec{w}[k] - \vec{w}[k]^H \vec{p} + \vec{w}[k]^H R \vec{w}[k] + \sigma_n^2,$$

In equation 3, E{•} represents an ensemble average.
Also, R, which is a (N×N) matrix, can be expressed by equation 4 below.

$$R = E\{\vec{x}[k]\vec{x}[k]^H\} \quad (4)$$

In equation 3, $\vec{P}$, which is a (N×1) vector, can be defined as equation 5 below.

$$\vec{p} = E\{\vec{x}[k]y^*[k]\} \quad (5)$$

In equation 3, $\epsilon$ is also called a cost function, and since the cost function $\epsilon$ is a quadratic function of $\vec{w}[k]$, an optimum coefficient vector $\vec{w}_{opt}$ at which the gradient of $\epsilon$ becomes zero so that $\epsilon$ reaches a minimum value can be obtained. If $\vec{\nabla}[k]$ is a gradient vector of $\epsilon$, $\vec{\nabla}[k]$ can be expressed by equation 6 below.

$$\vec{\nabla}[k] = 2\frac{\partial \varepsilon}{\partial \vec{w}[k]^*} = -2\vec{p} + 2R\vec{w}[k] \quad (6)$$

If the inverse matrix $R^{-1}$ of R exists, the optimum coefficient vector $\vec{w}_{opt}$ and the optimum power $\epsilon_{opt}$ of the error signal $\epsilon$ when $\vec{w}[k] = \vec{w}_{opt}$ are given as equations 7 and 8 below.

$$\vec{w}_{opt} = R^{-1} \vec{p} \quad (7)$$

$$\epsilon_{opt} = \sigma_y^2 - \vec{p}^H R^{-1} \vec{p} + \sigma_n^2 \quad (8)$$

However, since directly calculating the inverse matrix $R^{-1}$ in equation 7 requires a large amount of calculation, applying a method of directly obtaining the inverse matrix $R^{-1}$ in implementing a real system is improper in many cases. In those cases, an adaptive algorithm which repeatedly updates $\vec{w}[k]$ so that $\vec{w}[k]$ gradually converges on $\vec{w}_{opt}$ is utilized, instead of directly calculating the inverse matrix $R^{-1}$. One of adaptive algorithms that has been widely used for the purpose is a steepest descent algorithm, and the steepest descent algorithm is also called a gradient descent algorithm.

The steepest descent algorithm calculates a gradient vector $\vec{\nabla}[k]$ of $\epsilon$ with respect to the parameter vector $\vec{w}[k]$ using the fact that $\epsilon$ is a quadratic function of the parameter vector $\vec{w}[k]$, and updates the parameter vector $\vec{w}[k]$ by the magnitude of the calculated gradient vector $\vec{\nabla}[k]$ in the opposite direction of the gradient to thereby obtain a next parameter vector $\Delta \vec{w}[k+1]$.

By repeating the process, the parameter vector $\vec{w}[k]$ finally converges on the optimum coefficient vector $\vec{w}_{opt}$ for minimizing $\epsilon$ as the k value increases.

The steepest descent algorithm can be expressed by equation 9 below.

$$\vec{w}[k+1] = \vec{w}[k] - \frac{\mu}{2}\vec{\nabla}[k] = \vec{w}[k] - \mu(R\vec{w}[k] - \vec{p}) \quad (9)$$

A convergence speed of the steepest descent algorithm can be adjusted using a μ value. That is, the μ value, which is a proportional coefficient used to update the optimum coefficient vector $\vec{w}_{opt}$, decides the convergence speed. If the μ value is large, the convergence speed is fast, and if the μ value is small, the convergence speed is slow.

Meanwhile, if it is defined that $\Delta \vec{w}[k] = \vec{w}[k] - \vec{w}_{opt}$, equations 10 and 11 can be induced from equations 7 and 8.

$$\Delta \vec{w}[k+1] = (I - \mu R)\Delta \vec{w}[k] = (I - \mu R)^{k+1} \Delta \vec{w}[0] \quad (10)$$

$$\epsilon = \epsilon_{opt} + \Delta \vec{w}[k]^H R \Delta \vec{w}[k] \quad (11)$$

If $R = V\Lambda V^{-1}$ is given as eigen-value decomposition of R, $\Delta \vec{w}[k+1]$ can be rewritten as equation 12 below.

$$\Delta \vec{w}[k+1] = V(I - \mu \Lambda)^{k+1} V^{-1} \Delta \vec{w}[0] \quad (12)$$

As seen from equation 12, in order to make the steepest descent algorithm converge, the value has to satisfy equation 13 below.

$$0<\mu<1/\lambda_{max} \quad (13)$$

In order to implement the steepest descent algorithm written as equation 9, the matrix R and the vector $\vec{P}$ defined in equations 4 and 5 respectively have to be given. One method is to calculate time averages of samples and use the time averages as estimated values of R and $\vec{P}$, instead of directly obtaining R and $\vec{P}$ using an ensemble average. A well-known Least Mean Squares (LMS) algorithm uses a single sample of each of $\vec{x}[k]$ and y[k] in order to estimate R and $\vec{P}$, as written by equations 14 and 15 below.

$$\hat{R} = \vec{x}[k]\vec{x}[k]^H \quad (14)$$

$$\hat{\vec{P}} = \vec{x}[k]y^*[k] \quad (15)$$

As such, by estimating the instantaneous values of R and $\vec{P}$, the steepest descent algorithm is simplified to a LSM algorithm, which is expressed as equation 16 below.

$$\vec{w}[k+1] = \vec{w}[k] + \mu \vec{x}[k]e^*[k] \quad (16)$$

The convergence speed of the LSM algorithm may be adjusted using the $\mu$ value. As seen in equation 13, as the eigen-value is large, a small $\mu$ value may be used, and if the eigen-value is small, a large $\mu$ value may be used.

Figure 2A:
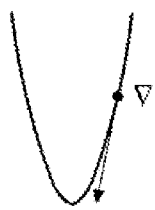
FIGS. 2A and 2B are views for explaining a convergence speed when a steepest descent algorithm is applied.
Figure 2B:
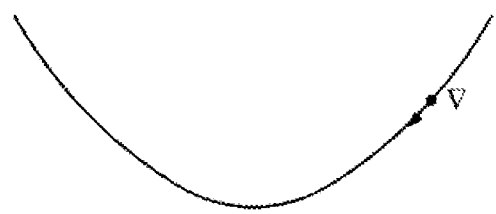

FIGS. 2A and 2B are views for explaining a convergence speed when the steepest descent algorithm is applied.

FIGS. 2A and 2B show curves of $\epsilon$ when two signals having different characteristics are input. However, since the $\mu$ value has to be smaller than $1/\lambda_{max}$, if the ratio $\lambda_{max}/\lambda_{min}$ of the maximum eigen-value with respect to the minimum eigen-value is large, the selected $\mu$ value may be too small in view of the minimum eigen-value, which may make the convergence speed of the LMS algorithm slow. In addition to such a convergence speed problem, the LMS algorithm may be subject to performance deterioration due to the influence by noise when noise is mixed in a measured signal.

Accordingly, in order to overcome the problem of the steepest descent algorithm, gravity is used. Since a new adaptive algorithm proposed in this specification has been developed based on physical characteristics that occur as a natural phenomenon, it has a stable characteristic by the law of energy conservation. Also, since the proposed adaptive algorithm has degrees of freedom two in adjusting the convergence speed of the adaptive algorithm, the adaptive algorithm can adjust the convergence speed and the convergence pattern more flexibly according to application fields.

Figure 3:
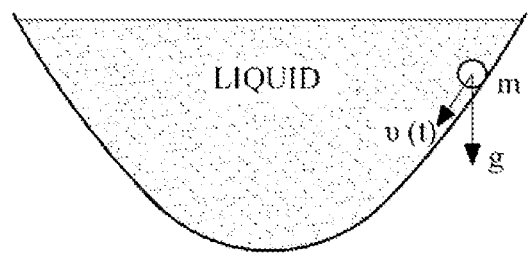
FIG. 3 is a view for explaining a principle of a gravity search adaptive algorithm.

FIG. 3 is a view for explaining a principle of a gravity search adaptive algorithm. FIG. 3 shows an example where a ball moves in a parabolic, concave container filled up with liquid, wherein m represents the mass of the ball and g represents the gravitational acceleration.

Since gravity pulls down the ball, the ball moves downward to the bottom of the container along the inner surface of the container. At this time, the potential energy of the ball is converted to kinetic energy to move the ball, the kinetic energy is lost due to friction with the liquid, and resultantly the ball is stopped at the lowest position (that is, the bottom of the container) of the container.

At this time, the behavior of the ball, that is, how fast the ball moves toward the bottom of the container or how quickly the ball is stopped at the bottom depends on the mass m of the ball, the magnitude g of gravitational acceleration g, and the friction force f of the liquid.

As such, a natural phenomenon can be used as a model to obtain an adaptive algorithm for solving a problem of finding a global minimum of a cost function which is in the form of a quadratic function. The adaptive algorithm is called a "gravity search adaptive algorithm", and the gravity search adaptive algorithm is stable and has a low risk of divergence compared to other adaptive algorithms that use no physical phenomenon associated with the law of energy conservation.

For easy understanding, a procedure of inducing a 1-dimensional gravity search adaptive algorithm whose coefficients are real numbers, a procedure of inducing a N-dimensional gravity search adaptive algorithm whose coefficients are real numbers, and a procedure of inducing a N-dimensional gravity search adaptive algorithm whose coefficients are complex numbers will be described in this order below.

<1-Dimensional Gravity Search Adaptive Algorithm>

In the case of a 1-dimensional gravity search adaptive algorithm, the cost function of equation 3 can be simplified to equation 17 below.

$$\epsilon = \sigma_y^2 - 2pw[k] + \sigma_x^2 w[k]^2 \quad (17)$$

where w[k] is a value resulting from k-th iteration of the coefficient w, $p = E\{x[k]y[k]\}$, and $\sigma_x^2 = E\{x^2[k]\}$.

First-order and second-order derivatives of the cost function with respect to w[k] are written as equations 18 and 19 below.

$$\frac{d\epsilon}{dw[k]} = \nabla[k] = 2\sigma_x^2 w[k] - 2p \quad (18)$$

$$\frac{d^2\epsilon}{dw[k]^2} = 2\sigma_x^2 \quad (19)$$

Figure 4:
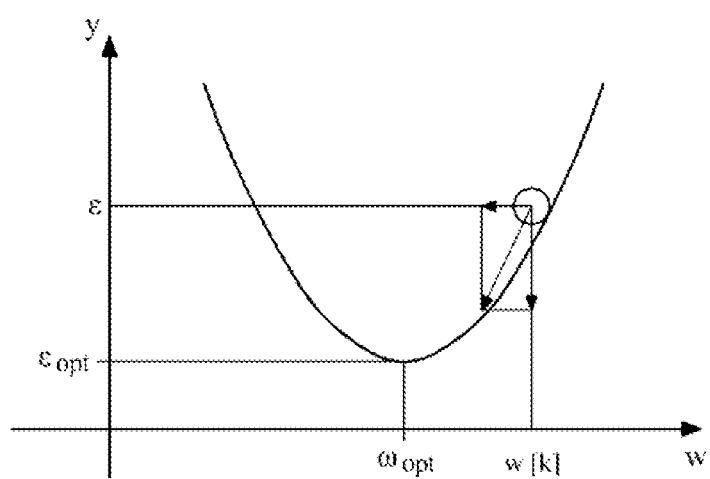
FIG. 4 is a view for explaining a relationship between є and a parameter when a single parameter is used.

FIG. 4 is a view for explaining a relationship between c and a parameter when a single parameter is used. The following description will be given with reference to FIGS. 3 and 4.

In FIG. 4, the w-axis represents the parameter, and the y-axis represents $\epsilon$. That is, $\epsilon$ is the second-order function of w[k], and the present invention is aimed at obtaining $w[k] = w_{opt}$ for minimizing $\epsilon$. The w-axis component of movement of a ball, which represents the position of the ball, can be represented as a second-order differential equation written by equation 20 below.

$$m\ddot{w} + f\dot{w} = F \quad (20)$$

where F represent a force applied to the ball in the direction of the w-axis, m represents the mass of the ball, f represents a friction force depending on viscosity of liquid, and $\dot{w}$ and $\ddot{w}$ are first-order and second-order derivatives with respect to time, respectively. The F value depends on the magnitude g of gravitation acceleration, the shape of the container, and the position and movement of the ball.

If the F value is assumed to be a constant and $v = \dot{w}$, equation 20 can be rewritten to equation 21 below.

$$\dot{v} = -\frac{f}{m}v + \frac{F}{m} \quad (21)$$

A solution of the differential equation of equation 21 can be expressed as equation 22 below.

$$v(t) = v(t_0)e^{-\frac{f}{m}(t-t_0)} + \frac{F}{m}\int_{t_0}^{t} e^{-\frac{f}{m}(t-\sigma)}d\sigma \quad (22)$$

By calculating the second term of the right side of equation 22, equation 22 can be arranged to equation 23 below.

$$v(t) = v(t_0)e^{-\frac{f}{m}(t-t_0)} + \frac{F}{f}(1 - e^{-\frac{f}{m}(t-t_0)}) \quad (23)$$

In equation 23, w(t) can be obtained as equation 24 below. v(t) is a derivative of w(t). So, if we know v(t), w(t) can be calculated by calculating the integral of v(t).

$$w(t) = w(t_0) + \int_{t_0}^{t} v(\tau)d\tau \quad (24)$$
$$= w(t_0) + \frac{F}{f}(t - t_0) + \left(v(t_0) - \frac{F}{f}\right)\frac{m}{f}(1 - e^{-\frac{f}{m}(t-t_0)})$$

If First-order Taylor Series Approximation is used, $$e^x = 1 + x + \frac{x^2}{2!} + \frac{x^3}{3!} + \cdots \approx 1 + x$$

when |x|≪1, and accordingly, if $$\left|\frac{f}{m}(t - t_0)\right| \ll 1,$$

equations 23 and 24 can be rewritten to equation 25 and 26 below.

$$v(t) = \quad (25)$$
$$v(t_0)e^{-\frac{f}{m}(t-t_0)} + \frac{F}{f}(1 - e^{-\frac{f}{m}(t-t_0)}) \approx v(t_0)\left(1 - \frac{f}{m}(t-t_0)\right) + \frac{F}{m}(t-t_0)$$

$$w(t) = w(t_0) + \frac{F}{f}(t-t_0) + \left(v(t_0) - \frac{F}{f}\right)\frac{m}{f}(1 - e^{-\frac{f}{m}(t-t_0)}) \approx \quad (26)$$
$$w(t_0) + v(t_0)(t-t_0)$$

In equation 24, if it is assumed that v(τ) is a constant in the integral interval, equation 24 can be rewritten to equation 27 below.

$$w(t) \approx w(t_0) + v(t_0)(t-t_0) \approx w(t_0) + v(t)(t-t_0) \quad (27)$$

In this case, equation 27 becomes identical to equation 26. This means that the First-order Taylor Series Approximation has the same effect as the assumption that v(τ) is a constant. Also, since equation 27 has been obtained under the same assumption that v(τ) is a constant, an approximate value having the same accuracy can be obtained. In this specification, equation 27 is used.

Equations 25 and 27 can be arranged and expressed as matrix equation 28 below.

$$[w(t) \; v(t)] = [w(t_0) \; v(t_0)] \quad (28)$$
$$\begin{bmatrix} 1 & 0 \\ 1 - \frac{f}{m}(t-t_0) & 1 - \frac{f}{m}(t-t_0) \end{bmatrix} + \left[\frac{F}{m}(t-t_0) \; \frac{F}{m}(t-t_0)\right]$$

Here, w(t) can be substituted by w[k+1], v(t) can be substituted by v[k+1], w($t_0$) can be substituted by w[k], v($t_0$) can be substituted by v[k], and F can be substituted by F[k], and t−$t_0$=$T_s$.

$T_s$ can be considered as a sampling interval and can be, for convenience of expansion, normalized to Ts=1.

When the substitutions are applied, equation 28 can be rewritten to equation 29 below.

$$[w[k+1] \; v[k+1]] = [w[k] \; v[k]]\begin{bmatrix} 1 & 0 \\ \beta & \beta \end{bmatrix} + \frac{F[k]}{m}[1 \; 1] \quad (29)$$

Here, since $$\beta = 1 - \frac{f}{m} \text{ and } \frac{f}{m}(t - t_0) \ll 1,$$

β has to satisfy equation 30 below.

$$1-\epsilon<\beta<1, \epsilon\ll1 \quad (30)$$

In equation 29, F[k] consists of two components as written in equation 31 below.

$$F[k] = F_g[k] + F_a[k] \quad (31)$$

where $F_g$[k] is a force applied to the ball by gravity, and $F_a$[k] is a force generated when the ball changes its direction while moving.

Figure 5:
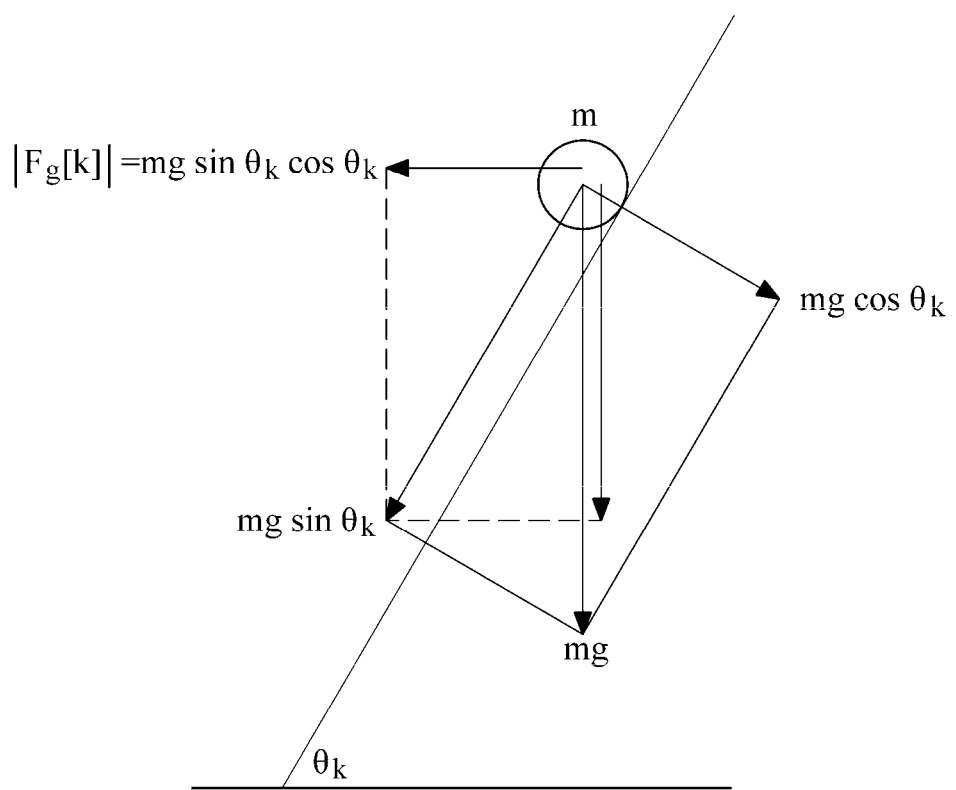
FIG. 5 is a view for explaining power components that act on a ball.

FIG. 5 is a view for explaining power components that act on the ball.

In FIG. 5, a force of gravity that pulls down the ball is denoted by mg, and the component applied in the w direction to the ball, among components of the force mg of gravity, is denoted by $F_g$[k].

Here, considering the fact that the direction of the force applied to the ball is in the opposite direction of the gradient vector, $F_g$[k] can be expressed using the characteristics of trigonometric functions of equation 32, as equation 33 below.

$$\sin\theta\cos\theta = \frac{\sin\theta\cos\theta}{\cos^2\theta + \sin^2\theta} = \frac{\sin\theta/\cos\theta}{1 + \sin^2\theta/\cos^2\theta} = \frac{\tan\theta}{1 + \tan^2\theta} \quad (32)$$

$$F_g[k] = -mg\sin\theta_k\cos\theta_k = -mg\frac{\tan\theta_k}{1 + \tan^2\theta_k} \quad (33)$$

By applying tan $\theta_k$=∇[k] to equation 33, equation 33 is rewritten to equation 34.

$$F_g[k] = -mg\frac{\nabla[k]}{1 + \nabla[k]^2} \quad (34)$$

Then, a process of obtaining $F_a$ will be described. When a differentiable function y=f(x) is given, curvature κ can be expressed as equation 35 below.

$$\kappa = \frac{|y''|}{(1 + y'^2)^{3/2}} \quad (35)$$

Acceleration generated when a certain object has a curvilinear motion at a velocity of v is in a direction perpendicular to the concave part of the curve, and if curvature of the curve is κ, the magnitude of the acceleration a can be expressed as equation 36 below.

$$a = v^2\kappa \quad (36)$$

When a ball goes down or up along the inner inclined surface of a container as illustrated in FIG. 4, the movement velocity v of the ball can be written by the horizontal velocity v[k] (that is, a component of the w[k] axis) of the ball, as equation 37 below.

$$v = \frac{v[k]}{\cos\theta_k} \tag{37}$$

Figure 6A:
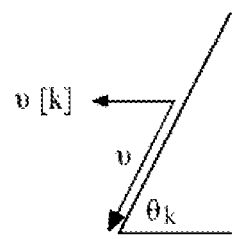
FIGS. 6A through 6C are views for explaining an acceleration according to a change in movement direction of a ball.
Figure 6B:
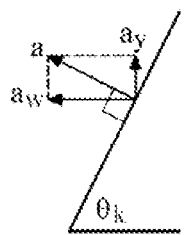
Figure 6C:
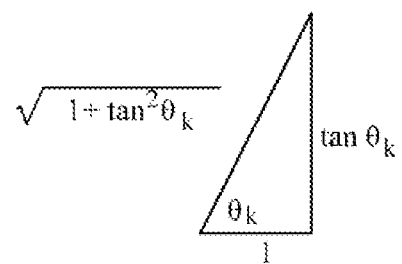

FIGS. 6A through 6C are views for explaining a change in acceleration according to a change in movement direction of a ball.

FIG. 6A shows the relationship between v and v[k]. Accordingly, the acceleration a can be written as equation 38 below.

$$a = \frac{v[k]^2}{\cos^2\theta_k}\kappa. \tag{38}$$

As illustrated in FIG. 6B, acceleration a is in a direction perpendicular to the inner surface of a container, and $a_w$ which is a component of the w[k] direction among the acceleration a can be written by equation 39 below.

$$a_w = a\sin\theta_k = \frac{v[k]^2 \sin\theta_k}{\cos^2\theta_k}\kappa = \frac{v[k]^2 \tan\theta_k}{\cos\theta_k}\kappa \tag{39}$$

As seen from FIG. 6C, since $\tan\theta_k = y'$ and $$\cos\theta_k = \frac{1}{\sqrt{\tan^2\theta_k + 1}},$$

equation 40 is induced, as follows.

$$a_w = \tag{40}$$

$$v[k]^2 y' \sqrt{y'^2 + 1}\,\kappa = v[k]^2 y' \sqrt{y'^2 + 1}\,\frac{|y''|}{(1 + y'^2)^{3/2}} = v[k]^2 y' \frac{|y''|}{1 + y'^2}$$

If $y' = \nabla[k]$ and $$y'' = \frac{d^2\varepsilon}{dw[k]^2}.$$

are applied to equation 40, equation 41 is induced from $|F_a[k]| = ma_w$ $$F_a[k] = -mv[k]^2 \nabla[k]\frac{|y''|}{1 + \nabla[k]^2} \tag{41}$$

Finally, a 1-dimensional gravity search adaptive algorithm induced from equations 29, 34, and 41 is expressed by equation 42 below.

$$[w[k+1] \quad v[k+1]] = [w[k] \quad v[k]]\begin{bmatrix} 1 & 0 \\ \beta & \beta \end{bmatrix} + g[k][1 \quad 1], \tag{42}$$

where $$\beta = 1 - \frac{f}{m},$$

m is the mass of the ball, f is the friction coefficient of liquid, and g is the gravitational acceleration. g[k] is defined by equation 43 below.

$$g[k] = -g\frac{\nabla[k]}{1 + \nabla[k]^2} - v[k]^2 \nabla[k]\frac{|y''|}{1 + \nabla[k]^2} \tag{43}$$

By applying equation 18 to equation 43, equation 44 is deduced as follows.

$$g[k] = -g\frac{2\sigma_x^2 w[k] - 2p}{1 + (2\sigma_x^2 w[k] - 2p)^2} - \frac{2\sigma_x^2 v[k]^2(2\sigma_x^2 w[k] - 2p)}{1 + (2\sigma_x^2 w[k] - 2p)^2} \tag{44}$$

<N-Dimensional Gravity Search Adaptive Algorithm>

The 1-dimensional gravity search adaptive algorithm can be easily expanded to an N-dimensional gravity search adaptive algorithm. It is assumed that $\vec{x}[k]$ and $\vec{w}[k]$ are N-dimensional signal and coefficient vectors, respectively.

Figure 7A:
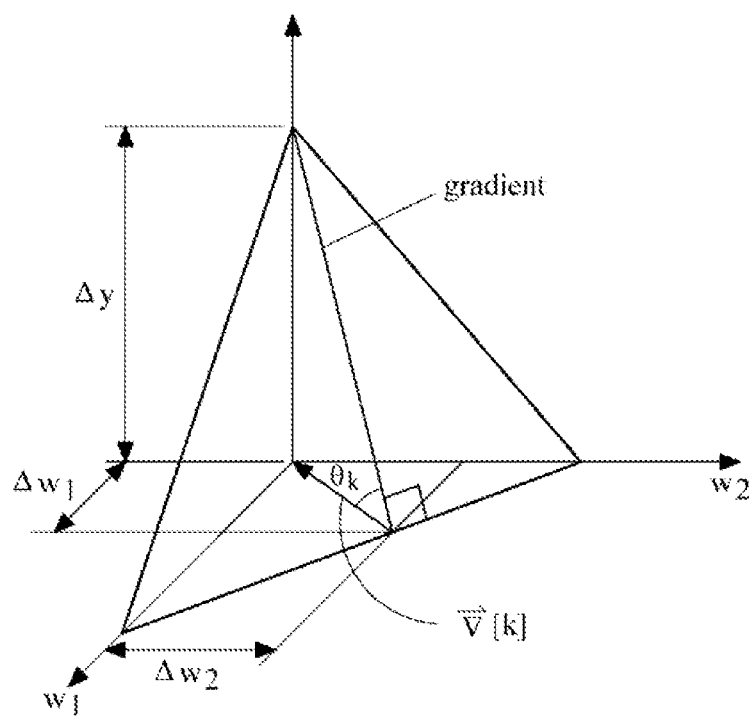
FIG. 7A shows a gradient vector $\vec{\nabla}[k]$.

FIG. 7A shows an N-dimensional gradient vector $\vec{\nabla}[k]$ when N=2.

Since $\vec{F}_g[k]$ indicates the opposite direction of the N-dimensional gradient vector $\vec{\nabla}[k]$, equation 45 is deduced from equation 33.

$$\vec{F}_g[k] = -mg\frac{\tan\theta_k}{1 + \tan^2\theta_k}\frac{\vec{\nabla}[k]}{\sqrt{\vec{\nabla}[k]^T \vec{\nabla}[k]}} \tag{45}$$

At this time, since $$\Delta y = \frac{\partial y}{\partial w_1}\Delta w_1 + \frac{\partial y}{\partial w_2}\Delta w_2 + \ldots + \frac{\partial y}{\partial w_N}\Delta w_N,$$

$\tan\theta_k$ can be expressed as equation 46 below.

$$\tan\theta_k = \tag{46}$$

$$\frac{\dfrac{\Delta y}{\sqrt{\Delta w_1^2 + \Delta w_2^2 + \ldots + \Delta w_N^2}}}{} = \frac{[\Delta w_1 \;\; \Delta w_2 \;\; \ldots \;\; \Delta w_N]\begin{bmatrix}\frac{\partial y}{\partial w_1}\\ \frac{\partial y}{\partial w_2}\\ \vdots \\ \frac{\partial y}{\partial w_N}\end{bmatrix}}{\sqrt{[\Delta w_1 \;\; \Delta w_2 \;\; \ldots \;\; \Delta w_N]\begin{bmatrix}\Delta w_1\\ \Delta w_2\\ \vdots \\ \Delta w_N\end{bmatrix}}}$$

Referring to FIG. 7A, equation 47 can be deduced for an arbitrary $\epsilon$ when $\epsilon \ll 1$, as follows.

$$\begin{bmatrix} \Delta w_1 \\ \Delta w_2 \\ \vdots \\ \Delta w_N \end{bmatrix} = \epsilon \frac{\vec{\nabla}[k]}{\sqrt{\vec{\nabla}[k]^T \vec{\nabla}[k]}} \tag{47}$$

Here, since $$\vec{\nabla}[k] = \begin{bmatrix} \frac{\partial y}{\partial w_1} \\ \frac{\partial y}{\partial w_2} \\ \vdots \\ \frac{\partial y}{\partial w_N} \end{bmatrix},$$

$\tan \theta_k$ can be expressed as equation 48 below.

$$\tan \theta_k = \frac{\epsilon \frac{\vec{\nabla}[k]^T \vec{\nabla}[k]}{\sqrt{\vec{\nabla}[k]^T \vec{\nabla}[k]}}}{\sqrt{\epsilon^2 \frac{\vec{\nabla}[k]^T \vec{\nabla}[k]}{\vec{\nabla}[k]^T \vec{\nabla}[k]}}} = \sqrt{\vec{\nabla}[k]^T \vec{\nabla}[k]} \tag{48}$$

Accordingly, in the case of the N-dimensional gravity search adaptive algorithm, $\vec{F}_g[k]$ can be represented by equation 49 below.

$$\vec{F}_g[k] = \tag{49}$$

$$-mg \frac{\sqrt{\vec{\nabla}[k]^T \vec{\nabla}[k]}}{1 + \vec{\nabla}[k]^T \vec{\nabla}[k]} \frac{\vec{\nabla}[k]}{\sqrt{\vec{\nabla}[k]^T \vec{\nabla}[k]}} = -mg \frac{1}{1 + \vec{\nabla}[k]^T \vec{\nabla}[k]} \vec{\nabla}[k]$$

In order to calculate $\vec{F}_a[k]$, curvature of the container in the direction of the movement of the ball has to be obtained.

Figure 7B:
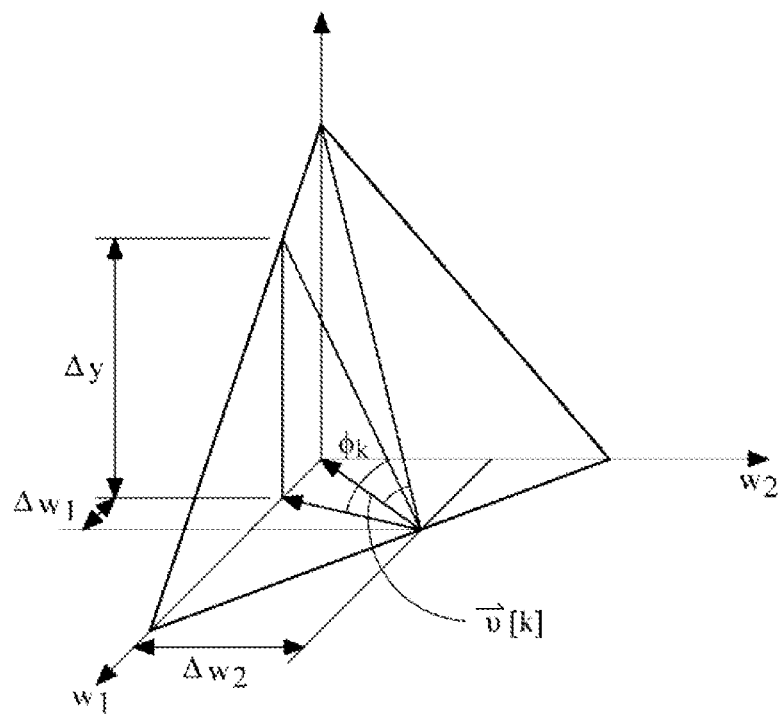
FIG. 7B shows a velocity vector $\vec{v}[k]$.

FIG. 7B shows an N-dimensional velocity vector $\vec{v}[k]$ when N=2.

The direction of the N-dimensional velocity vector $\vec{v}[k]$ is generally not parallel to the direction of $\vec{\nabla}[k]$.

Since $$\Delta y = \frac{\partial y}{\partial w_1} \Delta w_1 + \frac{\partial y}{\partial w_2} \Delta w_2 + \ldots + \frac{\partial y}{\partial w_N} \Delta w_N,$$

equation 50 can be obtained.

$$\tan \phi_k = \tag{50}$$

$$\frac{\Delta y}{\sqrt{\Delta w_1^2 + \Delta w_2^2 + \ldots + \Delta w_N^2}} = \frac{[\Delta w_1 \ \Delta w_2 \ \ldots \ \Delta w_N] \begin{bmatrix} \frac{\partial y}{\partial w_1} \\ \frac{\partial y}{\partial w_2} \\ \vdots \\ \frac{\partial y}{\partial w_N} \end{bmatrix}}{\sqrt{[\Delta w_1 \ \Delta w_2 \ \ldots \ \Delta w_N] \begin{bmatrix} \Delta w_1 \\ \Delta w_2 \\ \vdots \\ \Delta w_N \end{bmatrix}}}$$

However, if $$\begin{bmatrix} \Delta w_1 \\ \Delta w_2 \\ \vdots \\ \Delta w_N \end{bmatrix} = \epsilon \vec{v}[k]$$

for an arbitrary $\epsilon$ when $\epsilon \ll 1$, $\tan \Phi_k$ can be expressed as equation 51 below.

$$\tan \phi_k = \frac{\epsilon \vec{v}[k]^T \vec{\nabla}[k]}{\sqrt{\epsilon^2 \vec{v}[k]^T \vec{v}[k]}} = \frac{\vec{v}[k]^T \vec{\nabla}[k]}{\sqrt{\vec{v}[k]^T \vec{v}[k]}} \tag{51}$$

Figure 8:
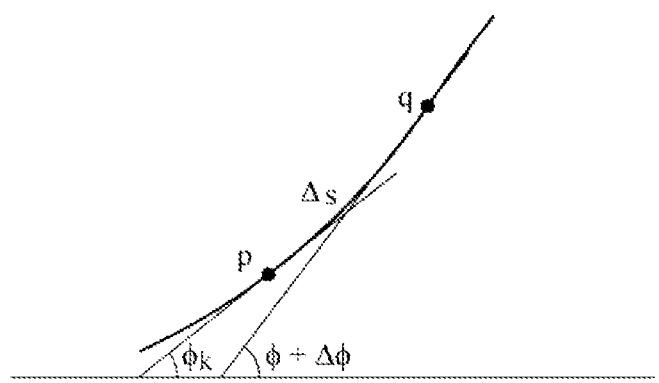
FIG. 8 shows the curvature of a curve.

If s is a trajectory of the ball that has moved along the inner surface of the container, curvature is defined as a change rate in movement direction when the ball moves by a unit distance. An example of such curvature is shown in FIG. 8. Referring to FIG. 8, as the ball moves by $\Delta s$, the movement direction changes by $\Delta \Phi$. Accordingly, by differentiating both sides of equation 51 with respect to s, the curvature is defined by equation 52 below.

$$\frac{d}{ds} \tan \phi_k = \frac{d}{ds} \left( \frac{\vec{v}[k]^T \vec{\nabla}[k]}{\sqrt{\vec{v}[k]^T \vec{v}[k]}} \right) = \tag{52}$$

$$\frac{1}{\sqrt{\vec{v}[k]^T \vec{v}[k]}} \frac{d}{ds} \left( \vec{v}[k]^T \vec{\nabla}[k] \right) = \frac{1}{\sqrt{\vec{v}[k]^T \vec{v}[k]}} \vec{v}[k]^T \frac{d \vec{\nabla}[k]}{ds}$$

Here, equation 52 is arranged to equation 53 below.

$$\frac{d}{ds} \tan \phi_k = \frac{d}{ds} \left( \frac{\sin \phi_k}{\cos \phi_k} \right) \tag{53}$$

$$= \frac{\sin^2 \phi_k + \cos^2 \phi_k}{\cos^2 \phi_k} \frac{d \phi_k}{ds}$$

$$= \frac{1}{\cos^2 \phi_k} \frac{d \phi_k}{ds}$$

$$= \frac{1}{\cos^2 \phi_k} k$$

Accordingly, equation 54 can be obtained from equation 53.

$$\kappa = \cos^2\phi_k \frac{1}{\sqrt{\vec{v}[k]^T \vec{v}[k]}} \vec{v}[k]^T \frac{d\vec{\nabla}[k]}{ds} \quad (54)$$

Here, $$\frac{d\vec{\nabla}[k]}{ds}.$$

can be represented as a product of R and a vector, as shown in equation 55.

$$\frac{d\vec{\nabla}[k]}{ds} = \frac{\partial w_1}{\partial s}\frac{\partial \vec{\nabla}[k]}{\partial w_1} + \frac{\partial w_2}{\partial s}\frac{\partial \vec{\nabla}[k]}{\partial w_2} + \ldots + \frac{\partial w_N}{\partial s}\frac{\partial \vec{\nabla}[k]}{\partial w_N} \quad (55)$$

$$= \begin{bmatrix} \frac{\partial \vec{\nabla}[k]}{\partial w_1} & \frac{\partial \vec{\nabla}[k]}{\partial w_2} & \cdots & \frac{\partial \vec{\nabla}[k]}{\partial w_N} \end{bmatrix} \begin{bmatrix} \frac{\partial w_1}{\partial s} \\ \frac{\partial w_2}{\partial s} \\ \vdots \\ \frac{\partial w_N}{\partial s} \end{bmatrix} = 2R \begin{bmatrix} \frac{\partial w_1}{\partial s} \\ \frac{\partial w_2}{\partial s} \\ \vdots \\ \frac{\partial w_N}{\partial s} \end{bmatrix}$$

Here, since $$\Delta s = \quad (56)$$

$$\sqrt{\epsilon^2 \vec{v}[k]^T \vec{v}[k] + (\epsilon \vec{v}[k]^T \vec{\nabla}[k])^2} = \epsilon \sqrt{\vec{v}[k]^T \vec{v}[k] + (\vec{v}[k]^T \vec{\nabla}[k])^2},$$

$$\frac{\partial w_n}{\partial s} = \lim_{\epsilon \to 0} \frac{\Delta w_n}{\Delta s} =$$

$$\lim_{\epsilon \to 0} \frac{\epsilon v_n[k]}{\epsilon \sqrt{\vec{v}[k]^T \vec{v}[k] + (\vec{v}[k]^T \vec{\nabla}[k])^2}} = \frac{v_n[k]}{\sqrt{\vec{v}[k]^T \vec{v}[k] + (\vec{v}[k]^T \vec{\nabla}[k])^2}}.$$

Where, $v_n[k]$ is the nth element of the vector $\vec{v}[k]$. Accordingly, equation 57 is deduced as follows.

$$\begin{bmatrix} \frac{\partial w_1}{\partial s} \\ \frac{\partial w_2}{\partial s} \\ \vdots \\ \frac{\partial w_N}{\partial s} \end{bmatrix} = \frac{1}{\sqrt{\vec{v}[k]^T \vec{v}[k] + (\vec{v}[k]^T \vec{\nabla}[k])^2}} \begin{bmatrix} v_0[k] \\ v_1[k] \\ \vdots \\ v_{N-1}[k] \end{bmatrix} = \quad (57)$$

$$\frac{1}{\sqrt{\vec{v}[k]^T \vec{v}[k] + (\vec{v}[k]^T \vec{\nabla}[k])^2}} \vec{v}[k]$$

Accordingly, equation 58 is deduced from equation 57, as follows.

$$\frac{d\vec{\nabla}[k]}{ds} = \frac{1}{\sqrt{\vec{v}[k]^T \vec{v}[k] + (\vec{v}[k]^T \vec{\nabla}[k])^2}} 2R\vec{v}[k] \quad (58)$$

As a result, the curvature is given as equation 59 below.

$$\kappa = \cos^2\phi_k \frac{1}{\sqrt{\vec{v}[k]^T \vec{v}[k]}} \frac{1}{\sqrt{\vec{v}[k]^T \vec{v}[k] + (\vec{v}[k]^T \vec{\nabla}[k])^2}} \vec{v}[k]^T 2R\vec{v}[k] \quad (59)$$

Accordingly, the acceleration a can be obtained by equation 60 below.

$$a = v^2 \kappa = \frac{\vec{v}[k]^T \vec{v}[k]}{\cos^2\phi_k} \kappa = \frac{\sqrt{\vec{v}[k]^T \vec{v}[k]}}{\sqrt{\vec{v}[k]^T \vec{v}[k] + (\vec{v}[k]^T \vec{\nabla}[k])^2}} \vec{v}[k]^T 2R\vec{v}[k] \quad (60)$$

Since the acceleration a is always in a direction perpendicular to the surface and is not related to the direction of $\vec{v}[k]$, $\vec{a}[k]$ can be expressed by equation 61 below. That is, the direction of a is perpendicular to the surface, and the direction of $\vec{v}[k]$ is tangential to the surface, but can be in any direction.

$$\vec{a}[k] = -a|\sin\phi_k| \frac{\vec{\nabla}[k]}{\sqrt{\vec{\nabla}[k]^T \vec{\nabla}[k]}} \quad (61)$$

$$= -|\sin\phi_k| \frac{\sqrt{\vec{v}[k]^T \vec{v}[k]}}{\sqrt{\vec{v}[k]^T \vec{v}[k] + (\vec{v}[k]^T \vec{\nabla}[k])^2}} \vec{v}[k]^T 2R\vec{v}[k] \cdot$$

$$\frac{\vec{\nabla}[k]}{\sqrt{\vec{\nabla}[k]^T \vec{\nabla}[k]}}$$

At this time, since equation 62 is satisfied, equation 63 is deduced.

$$|\sin\phi_k| = \frac{|\tan\phi_k|}{\sqrt{1 + \tan^2\phi_k}} = \quad (62)$$

$$\frac{\frac{|\vec{v}[k]^T \vec{v}[k]|}{\sqrt{\vec{v}[k]^T \vec{v}[k]}}}{\sqrt{1 + \frac{(\vec{v}[k]^T \vec{\nabla}[k])^2}{\vec{v}[k]^T \vec{v}[k]}}} = \frac{|\vec{v}[k]^T \vec{\nabla}[k]|}{\sqrt{\vec{v}[k]^T \vec{v}[k] + (\vec{v}[k]^T \vec{\nabla}[k])^2}}$$

-continued $$\vec{a}[k] = -\frac{\left|\vec{v}[k]^T \vec{\nabla}[k]\right|}{\sqrt{\vec{v}[k]^T \vec{v}[k] + \left(\vec{v}[k]^T \vec{\nabla}[k]\right)^2}} \quad (63)$$

$$\frac{\sqrt{\vec{v}[k]^T \vec{v}[k]}}{\sqrt{\vec{v}[k]^T \vec{v}[k] + \left(\vec{v}[k]^T \vec{\nabla}[k]\right)^2}} \cdot \vec{v}[k]^T 2R\vec{v}[k] \cdot$$

$$\frac{\vec{\nabla}[k]}{\sqrt{\vec{v}[k]^T \vec{\nabla}[k]}}$$

$$= -2 \frac{\left|\vec{v}[k]^T \vec{\nabla}[k]\right| \cdot \sqrt{\vec{v}[k]^T \vec{v}[k]}}{\vec{v}[k]^T \vec{v}[k] + \left(\vec{v}[k]^T \vec{\nabla}[k]\right)^2} \cdot \vec{v}[k]^T R\vec{v}[k] \cdot$$

$$\frac{\vec{\nabla}[k]}{\sqrt{\vec{\nabla}[k]^T \vec{\nabla}[k]}}$$

Finally, the N-dimensional gravity search adaptive algorithm is arranged to equation 64 below.

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1], \quad (64)$$

where $$\beta = 1 - \frac{f}{m},$$

where m is the mass of the ball, f is the friction coefficient of the liquid, and g is the gravitational acceleration. Also, g[k] is defined as equation 65 below.

$$\vec{g}[k] = \frac{-g}{1 + \vec{\nabla}[k]^T \vec{\nabla}[k]} \cdot \vec{\nabla}[k] - \quad (65)$$

$$2 \frac{\left|\vec{v}[k]^T \vec{\nabla}[k]\right| \cdot \sqrt{\vec{v}[k]^T \vec{v}[k]}}{\vec{v}[k]^T \vec{v}[k] + \left(\vec{v}[k]^T \vec{\nabla}[k]\right)^2} \cdot \vec{v}[k]^T R\vec{v}[k] \cdot \frac{\vec{\nabla}[k]}{\sqrt{\vec{\nabla}[k]^T \vec{\nabla}[k]}}$$

<N-dimensional Gravity Search Adaptive Algorithm Having Complex Coefficients>

If $\vec{x}[k]$ is an N-dimensional complex signal vector and $\vec{w}[k]$ is an N-dimensional complex coefficient vector, the cost function given by equation 3 above can be rewritten to equation 66 below.

$$\varepsilon = \sigma_y^2 - \vec{p}^H \vec{w}[k] - \vec{w}[k]^H \vec{p} + \vec{w}[k]^H R\vec{w}[k] + \sigma_n^2, \quad (66)$$

Real vectors $\vec{p}_r$; $\vec{p}_i$; $\vec{w}_r[k]$, $\vec{w}_i[k]$ and real matrices $R_r$ and $R_i$ are defined by equations 67, 68, and 69, respectively, below.

$$\vec{p} = \vec{p}_r + j\vec{p}_i \quad (67)$$

$$\vec{w}[k] = \vec{w}_r[k] + j\vec{w}_i[k] \quad (68)$$

$$R = R_r + jR_i \quad (69)$$

Here, the real matrices $R_r$ and $R_i$ satisfy equation 70 below.

$$R_r^T = R_r, R_i^T = -R_i \quad (70)$$

Equations 67, 68, and 69 are applied to equation 66, and equation 66 is rearranged to obtain equation 71 below.

$$\varepsilon = \sigma_y^2 - 2\vec{w}[k]^T \vec{P} + \vec{w}[k]^T R \vec{w}[k] + \sigma_n^2 \quad (71)$$

Here, $\vec{P}$, $\vec{w}[k]$, and R are defined by equation 72 below.

$$\vec{P} = \begin{bmatrix} \vec{p}_r \\ \vec{p}_i \end{bmatrix}; \vec{W}[k] = \begin{bmatrix} \vec{w}_r[k] \\ \vec{w}_i[k] \end{bmatrix}; \mathcal{R} = \begin{bmatrix} R_r & -R_i \\ R_i & R_r \end{bmatrix} \quad (72)$$

Equations 71 and 72 represent a problem with 2N-dimensional real coefficients. Accordingly, the gravity search adaptive algorithm using real numbers as coefficients, as obtained in equations 64 and 65, is used to calculate a 2N-dimensional gravity search adaptive algorithm as expressed as equations 73 and 74 below.

$$[\vec{W}[k+1] \quad \vec{V}[k+1]] = [\vec{W}[k] \quad \vec{V}[k]] \begin{bmatrix} 1 & 0 \\ \beta & \beta \end{bmatrix} + \vec{G}[k][1 \quad 1] \quad (73)$$

$$\vec{G}[k] = \frac{-g}{1 + \vec{D}[k]^T \vec{D}[k]} \vec{D}[k] - \quad (74)$$

$$2 \frac{\left|\vec{V}[k]^T \vec{D}[k]\right| \cdot \sqrt{\vec{V}[k]^T \vec{V}[k]}}{\vec{V}[k]^T \vec{V}[k] + \left(\vec{V}[k]^T \vec{D}[k]\right)^2} \cdot \vec{V}[k]^T \mathcal{R} \vec{V}[k] \cdot \frac{\vec{D}[k]}{\sqrt{\vec{D}[k]^T \vec{D}[k]}},$$

where $$\vec{D}[k] = \frac{\partial \varepsilon}{\partial \vec{W}[k]} = -2\vec{P} + 2\mathcal{R}\vec{W}[k].$$

It will be seen from equation 72 that equations 73 and 74 are different expressions of an adaptive algorithm for obtaining $\vec{w}_r[k]$ and $\vec{w}_i[k]$.

Accordingly, after obtaining $\vec{w}_r[k]$ and $\vec{w}_i[k]$ from the adaptive algorithm of equations 73 and 74, equations 67, 68, and 69 are used to obtain an N-dimensional complex gravity search adaptive algorithm, as expressed as equations 75 and 76 below.

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \quad (75)$$

$$\vec{g}[k] = \frac{-g}{1 + \vec{\nabla}[k]^H \vec{\nabla}[k]} \vec{\nabla}[k] - \quad (76)$$

$$\frac{\left|\vec{v}[k]^H \vec{\nabla}[k] + \vec{\nabla}[k]^H \vec{v}[k]\right| \cdot \sqrt{\vec{v}[k]^H \vec{v}[k]}}{\vec{v}[k]^H \vec{v}[k] + \frac{1}{4}\left(\vec{v}[k]^H \vec{\nabla}[k] + \vec{\nabla}[k]^H \vec{v}[k]\right)^2} \cdot \frac{\vec{v}[k]^H R \vec{v}[k]}{\sqrt{\vec{\nabla}[k]^H \vec{\nabla}[k]}} \cdot \vec{\nabla}[k]$$

<Simplification of N-Dimensional Gravity Search Adaptive Algorithm>

$\vec{g}[k]$ in equation 76 is composed of two terms; the first term is generated when gravity is applied to the ball, and the second term is generated by acceleration when the ball changes its movement direction while moving along the curved surface of the container.

Figure 9:
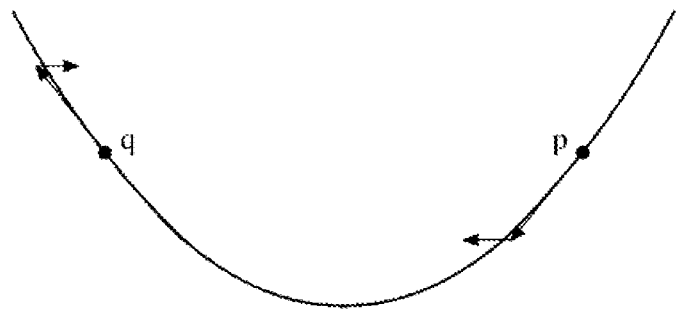
FIG. 9 is a view for explaining an acceleration when the movement direction of a ball changes.

FIG. 9 is a view for explaining a change in acceleration when the movement direction of a ball changes.

Since a change in acceleration due to a change in movement direction of a ball has a very small magnitude compared to the gravitational acceleration, for simplification of implementation, the acceleration due to the change in movement direction is ignored since it has little influence on performance of the adaptive algorithm. If the second term of $\vec{g}[k]$ in equation 76 is ignored, a simplified gravity search adaptive algorithm is deduced, which is expressed by equation 77 below.

$$[\vec{w}[k+1] \ \vec{v}[k+1]] = [\vec{w}[k] \ \vec{v}[k]]\begin{bmatrix} 1 & 0 \\ \beta & \beta \end{bmatrix} + \vec{g}[k][1 \ 1] \quad (77)$$

$$\vec{g}[k] = \frac{-g}{1+\vec{\nabla}[k]^H\vec{\nabla}[k]} \cdot \vec{\nabla}[k] \quad (78)$$

In equations 77 and 78, β is a parameter associated with inertia. If β is large, that is, if β is close to 1, the velocity of the ball does not change easily since the ball has a strong tendency to maintaining its own velocity, while if β is small, that is, if β is close to 0, the ball has a weak tendency to maintain its own velocity. If β is zero, the velocity of the ball depends only on a force currently applied to the ball regardless of the previous velocity of the ball. That is, when β is zero, the adaptive algorithm of equations 75 and 76 is rewritten to equation 79 below.

$$\vec{w}[k+1] = \vec{w}[k] + \frac{-g}{1+\vec{\nabla}[k]^H\vec{\nabla}[k]} \cdot \vec{\nabla}[k] - \quad (79)$$

$$\frac{|\vec{v}[k]^H\vec{\nabla}[k] + \vec{\nabla}[k]^H\vec{v}[k]| \cdot \sqrt{\vec{v}[k]^H\vec{v}[k]}}{\vec{v}[k]^H\vec{v}[k] + \frac{1}{4}(\vec{v}[k]^H\vec{\nabla}[k] + \vec{\nabla}[k]^H\vec{v}[k])^2} \cdot \frac{\vec{v}[k]^H R\vec{v}[k]}{\sqrt{\vec{\nabla}[k]^H\vec{\nabla}[k]}} \cdot \vec{\nabla}[k]$$

Also, when β is zero, the adaptive algorithm of equations 77 and 78 is rewritten to equation 81 below.

$$\vec{w}[k+1] = \vec{w}[k] + \frac{-g}{1+\vec{\nabla}[k]^H\vec{\nabla}[k]} \cdot \vec{\nabla}[k] \quad (80)$$

<Gravity Search LMS (GS-LMS) Algorithm>

Like the steepest descent algorithm, in order to implement a GS-LMS algorithm, R and $\vec{p}$ have to be given. Like when inducing a LMS algorithm, the case of estimating R and $\vec{p}$ from instantaneous values of the signal as given in equations 14 and 15 is called a GS-LMS algorithm.

A gradient vector can be deduced from equations 14 and 15, which is expressed as equation 81 below.

$$\vec{\nabla}[k] = -2\vec{p} + 2R\vec{w}[k] = -2(\vec{x}[k]y^*[k] - \vec{x}[k]\vec{x}[k]^H\vec{w}[k]) \quad (81)$$
$$= -2\vec{x}[k](y^*[k] - \vec{x}[k]^H\vec{w}[k]) = -2\vec{x}[k](y^*[k] - \hat{y}^*[k])$$
$$= -2\vec{x}[k]e^*[k]$$

Equation 81 is applied to equation 76, thus deducing equation 82.

$$\vec{g}[k] = \frac{-g}{1+\vec{\nabla}[k]^H\vec{\nabla}[k]} \cdot \vec{\nabla}[k] - \quad (82)$$

$$\frac{|\vec{v}[k]^H\vec{\nabla}[k] + \vec{\nabla}[k]^H\vec{v}[k]| \cdot \sqrt{\vec{v}[k]^H\vec{v}[k]}}{\vec{v}[k]^H\vec{v}[k] + \frac{1}{4}(\vec{v}[k]^H\vec{\nabla}[k] + \vec{\nabla}[k]^H\vec{v}[k])^2} \cdot$$

$$\frac{\vec{v}[k]^H R\vec{v}[k]}{\sqrt{\vec{\nabla}[k]^H\vec{\nabla}[k]}} \cdot \vec{\nabla}[k]$$

$$= \frac{2g}{1+1e[k]\vec{x}[k]^H\vec{x}[k]e*[k]}\vec{x}[k]e^*[k] +$$

$$\frac{2|\vec{v}[k]^H\vec{x}[k]e^*[k] + e[k]\vec{x}[k]^H\vec{v}[k]| \cdot \sqrt{\vec{v}[k]^H\vec{v}[k]}}{\vec{v}[k]^H\vec{v}[k] + (\vec{v}[k]^H\vec{x}[k]e^*[k] + e[k]\vec{x}[k]^H\vec{v}[k])^2} \cdot$$

$$\frac{\vec{v}[k]^H\vec{x}[k]\vec{x}[k]^H\vec{v}[k]}{2\sqrt{e[k]\vec{x}[k]^H\vec{x}[k]e^*[k]}} \cdot (2\vec{x}[k]e^*[k])$$

If it is defined that $z[k] = \vec{v}[k]^H\vec{x}[k]$ and $\vec{g}[k]$ is represented in terms of $z[k]$, equation 82 can be rewritten to equation 83 below.

$$\vec{g}[k] = \frac{2g}{1+4e[k]\vec{x}[k]^H\vec{x}[k]e*[k]}\vec{x}[k]e^*[k] + \quad (83)$$

$$\frac{2|z[k]e^*[k] + e[k]z^*[k]| \cdot \sqrt{\vec{v}[k]^H\vec{v}[k]}}{\vec{v}[k]^H\vec{v}[k] + (z[k]e^*[k] + e[k]z^*[k])^2} \cdot$$

$$\frac{z[k]z^*[k]}{\sqrt{e[k]\vec{x}[k]^H\vec{x}[k]e^*[k]}}\vec{x}[k]e^*[k]$$

$$= \frac{2g}{1+4e[k]\vec{x}[k]^H\vec{x}[k]e^*[k]}\vec{x}[k]e^*[k] +$$

$$\frac{4|\Re\{z[k]e^*[k]\}| \cdot \sqrt{\vec{v}[k]^H\vec{v}[k]}}{\vec{v}[k]^H\vec{v}[k] + 4\Re\{z[k]e^*[k]\}^2} \cdot$$

$$\frac{|z[k]|^2}{\sqrt{e[k]\vec{x}[k]^H\vec{x}[k]e^*[k]}}\vec{x}[k]e^*[k],$$

Here, $\Re\{\cdot\}$ represents the real part of the complex number. Accordingly, from equations 83 and 73, the GS-LMS algorithm is given as equations 84 and 85 below.

$$[\vec{w}[k+1] \ \vec{v}[k+1]] = [\vec{w}[k] \ \vec{v}[k]]\begin{bmatrix} 1 & 0 \\ \beta & \beta \end{bmatrix} + \vec{g}[k][1 \ 1] \quad (84)$$

$$\vec{g}[k] = \left(\frac{2g}{1+4e[k]\vec{x}[k]^H\vec{x}[k]e^*[k]} + \quad (85)\right.$$

$$\left.\frac{4|\Re\{z[k]e^*\}| \cdot \sqrt{\vec{v}[k]^H\vec{v}[k]}}{\vec{v}[k]^H\vec{v}[k] + 4\Re\{z[k]e^*[k]\}^2} \cdot \frac{|z[k]|^2}{\sqrt{e[k]\vec{x}[k]^H\vec{x}[k]e^*[k]}}\right)\vec{x}[k]e^*[k]$$

Meanwhile, if the acceleration component due to a change in movement direction of the ball is ignored from $\vec{g}[k]$, equations 75 and 79 are rewritten to a simplified GS-LMS algorithm, which is expressed as equations 86 and 87 below.

$$[\vec{w}[k+1] \ \vec{v}[k+1]] = [\vec{w}[k] \ \vec{v}[k]]\begin{bmatrix} 1 & 0 \\ \beta & \beta \end{bmatrix} + \vec{g}[k][1 \ 1] \quad (86)$$

$$g[k] = \frac{2g}{1+4e[k]\vec{x}[k]^H\vec{x}[k]e^*[k]}\vec{x}[k]e^*[k] \quad (87)$$

If β is zero, equation 79 can be rewritten to a simplified GS-LMS algorithm, which is expressed as equation 88 below.

$$\vec{w}[k+1] = \tag{88}$$
$$\vec{w}[k] + \left( \frac{2g}{1 + 4e[k]\vec{x}[k]^H \vec{x}[k]e^*[k]} + \frac{4|\Re\{z[k]e^*[k]\}| \cdot \sqrt{\vec{v}[k]^H \vec{v}[k]}}{\vec{v}[k]^H \vec{v}[k] + 4\Re\{z[k]e^*[k]\}^2} \right.$$
$$\left. \frac{|z[k]|^2}{\sqrt{e[k]\vec{x}[k]^H \vec{x}[k]e^*[k]}} \right) \vec{x}[k]e^*[k]$$

If β is zero, equation 80 can be rewritten to a simplified GS-LMS algorithm, which is expressed as equation 89 below.

$$\vec{w}[k+1] = \vec{w}[k] + \frac{2g}{1 + 4e[k]\vec{x}[k]^H \vec{x}[k]e^*[k]} \vec{x}[k]e^*[k] \tag{89}$$

In equation 87, $\vec{g}[k]$ has been normalized with respect to both $\vec{x}[k]$ and $\vec{e}[k]$. Accordingly, the convergence speed of the simplified GS-LMS algorithm of equations 86 and 87 may become slow during the early stage of adaptation when the power of e[k] is large. In this case, one method for improving the convergence speed is to vary g over time.

For example, it is possible to make g be in proportion to the power of an error signal e[k], as follows.

$$g[k] = \tilde{g}|e[k]|^2 \tag{90}$$

By applying equation 90 to equation 87, equations 91 and 92 are obtained as follows.

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \tag{91}$$

$$\vec{g}[k] = \frac{2\tilde{g}|e[k]|^2}{1 + 4e[k]\vec{x}[k]^H \vec{x}[k]e^*[k]} \vec{x}[k]e^*[k] \tag{92}$$

Here, a range of the $\tilde{g}$ value is given by equation 93 below.

$$0 < \frac{\tilde{g}}{(1-\beta)} < 2 \tag{93}$$

If β is zero, equations 91 and 92 can be rewritten to equation 94 below.

$$\vec{w}[k+1] = \vec{w}[k] + \frac{2\tilde{g}|e[k]|^2}{1 + 4e[k]\vec{x}[k]^H \vec{x}[k]e^*[k]} \vec{x}[k]e^*[k] \tag{94}$$

The adaptive algorithm written as equation 94 has a structure that is very similar to the normalized LMS algorithm of equation 95.

$$\vec{w}[k+1] = \vec{w}[k] + \frac{\tilde{\mu}}{\delta + \vec{x}[k]^H \vec{x}[k]} \vec{x}[k]e^*[k] \tag{95}$$

For easy comparison, equation 94 is rearranged to equation 96 below.

$$\vec{w}[k+1] = \vec{w}[k] + \frac{\tilde{g}/2}{1/4|e[k]|^2 + \vec{x}[k]^H \vec{x}[k]} \vec{x}[k]e^*[k] \tag{96}$$

If equations 97 and 98 below are satisfied, equation 95 becomes identical to equation 96.

$$\delta = \frac{1}{4|e[k]|^2} \tag{97}$$

$$\tilde{\mu} = \frac{\tilde{g}}{2} \tag{98}$$

This means that if there is no memory in the GS-LMS algorithm of equation 94, the GS-LMS algorithm becomes a normalized LMS algorithm. According to a different interpretation, this means that a GS-LMS algorithm is an enhanced version of the normalized LMS by introducing memory or inertia.

The above interpretation about the GS-LMS algorithm has very important significance. The reason is because the characteristics of the GS-LMS algorithm can be understood based on the well-known characteristics of the normalized LMS algorithm.

It is assumed that equations 99 and 100 below are satisfied.

$$1 << 4e[k]\vec{x}[k]^H \vec{x}[k]e^*[k] \tag{99}$$

$$4\delta|e[k]|^2 << 4e[k]\vec{x}[k]^H \vec{x}[k]e^*[k] \tag{100}$$

In this case, the GS-LMS algorithm may be further simplified. That is, under the assumption, equation 92 can be rewritten to equation 101 below.

$$\vec{g}[k] = \frac{2\tilde{g}|e[k]|^2}{4\delta|e[k]|^2 + 4e[k]\vec{x}[k]^H \vec{x}[k]e^*[k]} \vec{x}[k]e^*[k] \tag{101}$$

By arranging equation 101, the algorithms of equations 91 and 92 are simplified to equation 102 and 103 below.

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \tag{102}$$

$$\vec{g}[k] = \frac{\tilde{\mu}}{\delta + \vec{x}[k]^H \vec{x}[k]} \vec{x}[k]e^*[k] \tag{103}$$

Also, the algorithms of equations 101 and 103 become identical to the normalized LMS algorithm when β is zero.

Figure 10:
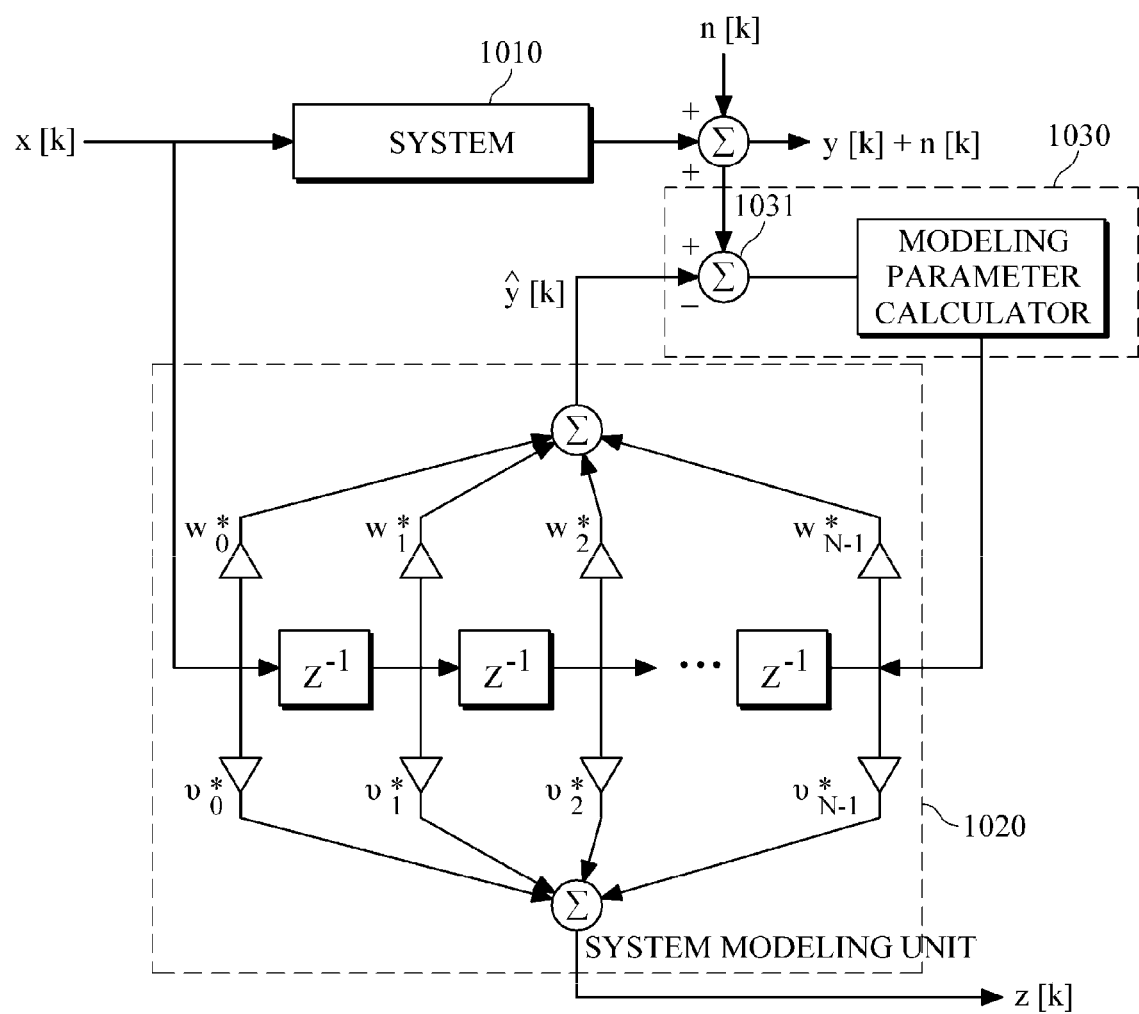
FIG. 10 is a diagram illustrating an example of a gravity search adaptive apparatus.

FIG. 10 is a diagram illustrating an example of a gravity search adaptive apparatus.

The gravity search adaptive apparatus illustrated in FIG. 10 corresponds to an example where the GS-LMS algorithm is used. In FIG. 10, a modeling parameter calculator 1030 uses the gravity search adaptive algorithm described above to update a parameter for making an error signal output from an error detector 1031 converge on a minimum value and to apply the updated parameter to a system modeling unit 1020.

Figure 11:
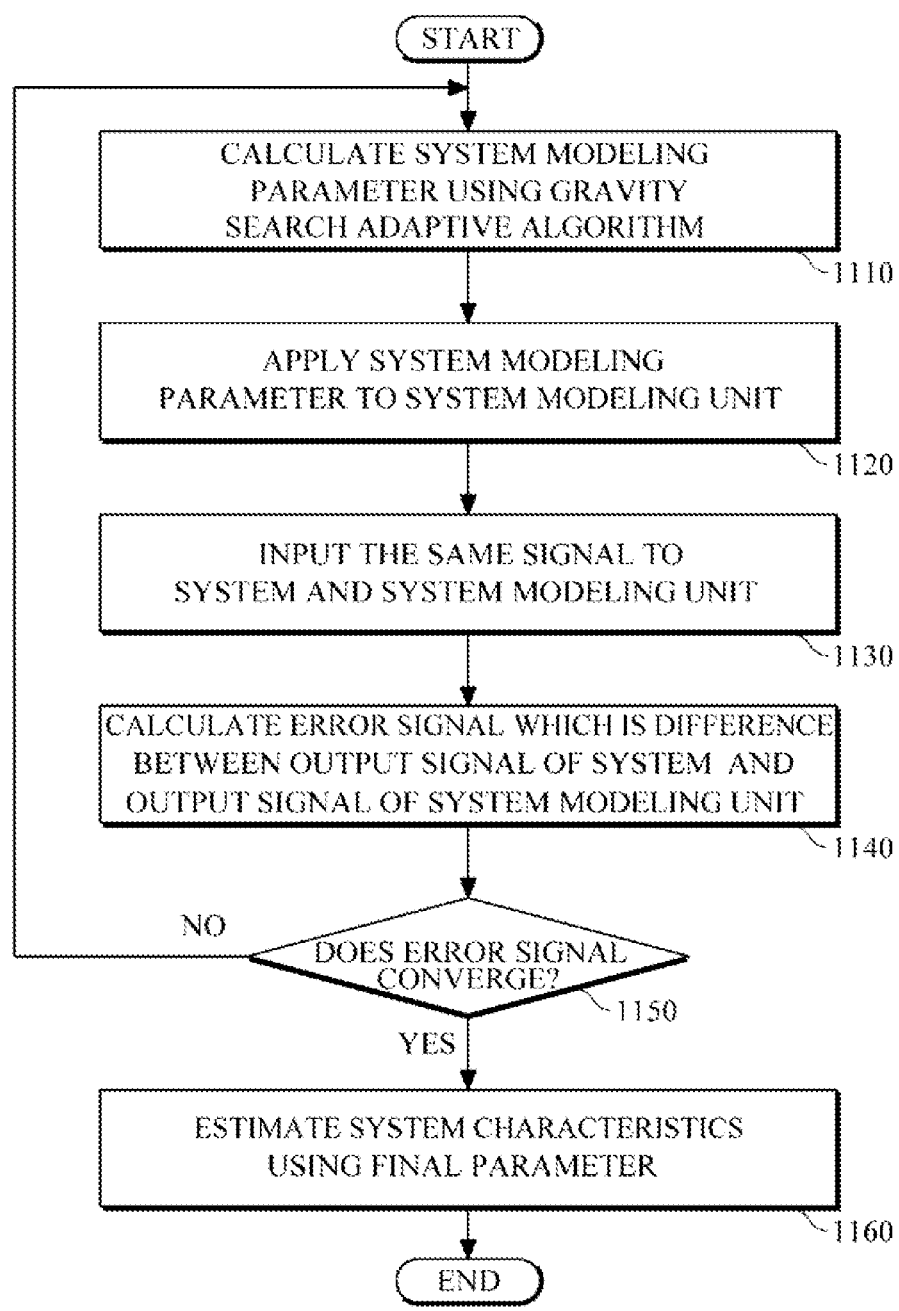
FIG. 11 is a flowchart illustrating an example of a system modeling method using a gravity search adaptive algorithm.

FIG. 11 is a flowchart illustrating an example of a system modeling method using a gravity search adaptive algorithm.

Referring to FIGS. 10 and 11, an adaptive controller 1030 calculates a system modeling parameter using the gravity search adaptive algorithm (1110). The system modeling parameter is a value for minimizing an error signal which is a difference between an output signal of a real system and a modeled signal.

Then, the adaptive controller 1030 applies the system modeling parameter to the system modeling unit 1020 (1120). Then, the adaptive controller 1030 applies the same signal to both the system 1010 and the system modeling unit 1020 (1130). Then, the adaptive controller 1030 calculates an error signal which is a difference between an output signal of the system 1010 and an output signal of the system modeling unit 1020 (1140). Successively, the adaptive controller 1030 compares the error signal to the previously calculated error signal to thereby determine whether the error signal converges on a minimum value (1150).

If it is determined in operation 1150 that the error signal does not converge on a minimum value, the adaptive controller 1030 returns to operation 1110 to update the system modeling parameter using the gravity search adaptive algorithm. That is, the procedure from operation 1110 to operation 1150 is repeated until the error signal converges on the minimum value.

Also, when calculating a system parameter using the gravity search adaptive algorithm, under an assumption that a ball moves along the inner surface of a parabolic, concave container filled up with liquid, the adaptive controller 1030 sets the mass m of the ball, a friction force g of liquid, a sampling interval $T_s$, and a force $F_k$ applied to the ball, and applies the set values to equation 37 to thereby calculate or update a parameter of the system modeling unit 1020.

Meanwhile, if it is determined in operation 1150 that the error signal converges on the minimum, the adaptive controller 1030 estimates the characteristics of the system 1010 using a final parameter calculated in operation 1160.

Therefore, as described above, the gravity search adaptive apparatus and method can easily adjust a convergence speed and a convergence pattern.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A gravity search adaptive apparatus for modeling a system, the apparatus comprising:
a system modeling circuit configured to receive an input signal input to the system, to convert the input signal using a model parameter vector, and to output the converted signal; and
an adaptive controller configured to calculate, using a gravity search adaptive algorithm for solving a problem of finding a global minimum of a cost function which is in the form of a quadratic function, the model parameter vector when an error signal, which is a difference between an output signal of the system and an output signal of the system modeling circuit, converges on a minimum power value, and to apply the calculated model parameter vector to the system modeling circuit,
wherein the adaptive controller calculates a power value $\epsilon$ of the error signal, the power value $\epsilon$ being expressed as equation 104 below:

$$\epsilon = \sigma_y^2 - 2pw[k] + \sigma_x^2 w[k]^2 \quad (104),$$

where w[k] is the model parameter vector resulting from k-th iteration of the calculation of the model parameter vector, $p = E\{x[k]y[k]\}$, $\sigma_x^2 = E\{x^2[k]\}$, x[k] is the input signal, y[k] is the output signal of the system, $\sigma_y^2$ is $E\{y^2[k]\}$, and $E\{\bullet\}$ represents an ensemble average.

2. The gravity search adaptive apparatus of claim 1, wherein the adaptive controller comprises:
an error detector configured to detect and output the error signal; and
a modeling parameter calculator configured to calculate the model parameter vector when the error signal converges on the minimum power value and to apply the calculated model parameter vector to the system modeling unit.

3. The gravity search adaptive apparatus of claim 1, wherein the gravity search adaptive algorithm is estimated under an assumption that a ball moves along an inner surface of a parabolic, concave container filled up with liquid.

4. The gravity search adaptive apparatus of claim 3, wherein the gravity search adaptive algorithm uses a second-order differential equation 105 below:

$$m\ddot{w} + f\dot{w} = F \quad (105),$$

where w represents the model parameter vector of the system modeling circuit, F represents a force applied to the ball in a direction of w, m represents a mass of the ball, f represents a friction force depending on viscosity of the liquid, and $\dot{w}$ and $\ddot{w}$ represent a first-order derivative and a second-order derivative with respect to time, respectively.

5. The gravity search adaptive apparatus of claim 3, wherein the adaptive controller updates the model parameter vector of the system modeling circuit using a first-order gravity search adaptive algorithm that is expressed as equation 106 below:

$$[\bar{w}[k+1] \quad \bar{v}[k+1]] = [\bar{w}[k] \quad \bar{v}[k]] \begin{bmatrix} 1 & 0 \\ \beta & \beta \end{bmatrix} + \bar{g}[k][1 \quad 1] \quad (106)$$

where $$\beta = 1 - \frac{f}{m},$$

m represents a mass of the ball, f represents a friction coefficient of the liquid, v[k] is a horizontal velocity of the ball, g represents gravitational acceleration, g[k] is defined as equation 107 below:

$$g[k] = -g\frac{\Delta[k]}{1+\nabla[k]^2} - v[k]^2 \nabla[k]\frac{|y''|}{1+\nabla[k]^2}, \quad (107)$$

where $\nabla[k]$ is defined as follows:

$$\frac{d\varepsilon}{dw[k]} = \nabla[k],$$

and y″ is defined as follows:

$$y'' = \frac{d^2 \varepsilon}{dw[k]^2}.$$

6. The gravity search adaptive apparatus of claim 3, wherein the adaptive controller updates the model parameter vector of the system modeling circuit using an N-dimensional gravity search adaptive algorithm that is expressed as equation 108 below:

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \quad (108)$$

where w represents the model parameter vector of the system modeling circuit, v represents a change velocity of w, $$\beta = 1 - \frac{f}{m},$$

m represents a mass of the ball, f is a friction coefficient of the liquid, g represents gravitational acceleration, and g[k] is defined as equation 109 below:

$$\vec{g}[k] = \frac{-g}{1 + \vec{\nabla}[k]^T \vec{\nabla}[k]} \cdot \vec{\nabla}[k] - \qquad (109)$$

$$2 \frac{|\vec{v}[k]^T \vec{\nabla}[k]| \cdot \sqrt{\vec{v}[k]^T \vec{v}[k]}}{\vec{v}[k]^T \vec{v}[k] + (\vec{v}[k]^T \vec{\nabla}[k])^2} \cdot \vec{v}[k]^T R \vec{v}[k] \cdot \frac{\vec{\nabla}[k]}{\sqrt{\vec{\nabla}[k]^T \vec{\nabla}[k]}}.$$

where R is defined as follows:
$$R = E\{\vec{\mathbf{x}}[k] \vec{\mathbf{x}}[k]^H\},$$

H representing Hermitian Transpose, and ∇[k] is defined as follows:

$$\frac{d\varepsilon}{dw[k]} = \nabla[k].$$

7. The gravity search adaptive apparatus of claim 3, wherein the adaptive controller updates the model parameter vector of the system modeling circuit using an N-dimensional gravity search adaptive algorithm having complex coefficients that are expressed as equation 110 below:

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \quad (110)$$

where w represents the model parameter vector of the system modeling circuit, v represents a change velocity of w, $$\beta = 1 - \frac{f}{m},$$

m represents a mass of the ball, f represents a friction coefficient of the liquid, g represents gravitational acceleration, and g[k] is defined as equation 111 below:

$$\vec{g}[k] = \frac{-g}{1 + \vec{\nabla}[k]^H \vec{\nabla}[k]} \cdot \vec{\nabla}[k] - \qquad (111)$$

$$\frac{|\vec{v}[k]^H \vec{\nabla}[k] + \vec{\nabla}[k]^H \vec{v}[k]| \cdot \sqrt{\vec{v}[k]^H \vec{v}[k]}}{\vec{v}[k]^H \vec{v}[k] + \frac{1}{4}(\vec{v}[k]^H \vec{\nabla}[k] + \vec{\nabla}[k]^H \vec{v}[k])^2} \cdot \frac{\vec{v}[k]^H R \vec{v}[k]}{\sqrt{\vec{\nabla}[k]^H \vec{\nabla}[k]}} \cdot \vec{\nabla}[k],$$

where R is defined as follows:
$$R = E\{\vec{\mathbf{x}}[k] \vec{\mathbf{x}}[k]^H\},$$

H representing Hermitian Transpose, and ∇[k] is defined as follows:

$$\frac{d\varepsilon}{dw[k]} = \nabla[k].$$

8. The gravity search adaptive apparatus of claim 7, wherein if a parameter β associated with inertia is zero, algorithms of equations 110 and 111 are expressed as equation 112 below:

$$\vec{w}[k+1] = \vec{w}[k] + \frac{-g}{1 + \vec{\nabla}[k]^H \vec{\nabla}[k]} \cdot \vec{\nabla}[k] - \qquad (112)$$

$$\frac{|\vec{v}[k]^H \vec{\nabla}[k] + \vec{\nabla}[k]^H \vec{v}[k]| \cdot \sqrt{\vec{v}[k]^H \vec{v}[k]}}{\vec{v}[k]^H \vec{v}[k] + \frac{1}{4}(\vec{v}[k]^H \vec{\nabla}[k] + \vec{\nabla}[k]^H \vec{v}[k])^2} \cdot \frac{\vec{v}[k]^H R \vec{v}[k]}{\sqrt{\vec{\nabla}[k]^H \vec{\nabla}[k]}} \cdot \vec{\nabla}[k].$$

9. The gravity search adaptive apparatus of claim 3, wherein the adaptive controller updates the model parameter vector of the system modeling circuit using a gravity search adaptive algorithm that is expressed as equation 113 below:

$$[\vec{w}[k+1] \quad \vec{v}[k+1]] = [\vec{w}[k] \quad \vec{v}[k]] \begin{bmatrix} 1 & 0 \\ \beta & \beta \end{bmatrix} + \vec{g}[k][1 \quad 1] \quad (113)$$

where w represents the model parameter vector of the system modeling circuit, $$\beta = 1 - \frac{f}{m},$$

v represents a change velocity of w, m represents a mass of the ball, f represents a friction coefficient of the liquid, g represents gravitational acceleration, and g[k] is defined as equation 114 below:

$$\vec{g}[k] = \frac{-g}{1 + \vec{\nabla}[k]^H \vec{\nabla}[k]} \cdot \vec{\nabla}[k], \qquad (114)$$

where ∇[k] is defined as follows:

$$\frac{d\varepsilon}{dw[k]} = \nabla[k].$$

10. The gravity search adaptive apparatus of claim 9, wherein if a parameter β associated with inertia is zero, algorithms of equations 113 and 114 are expressed as equation 115 below:

$$\vec{w}[k+1] = \vec{w}[k] + \frac{-g}{1+\vec{\nabla}[k]^H \vec{\nabla}[k]} \cdot \vec{\nabla}[k] - \tag{115}$$

$$\frac{|\vec{v}[k]^H \vec{\nabla}[k] + \vec{\nabla}[k]^H \vec{v}[k]| \cdot \sqrt{\vec{v}[k]^H \vec{v}[k]}}{\vec{v}[k]^H \vec{v}[k] + \frac{1}{4}(\vec{v}[k]^H \vec{\nabla}[k] + \vec{\nabla}[k]^H \vec{v}[k])^2} \cdot \frac{\vec{v}[k]^H R \vec{v}[k]}{\sqrt{\vec{\nabla}[k]^H \vec{\nabla}[k]}} \cdot \vec{\nabla}[k],$$

where R is defined as follows:

$$R = E\{\vec{\mathbf{x}}[k]\vec{\mathbf{x}}[k]^H\},$$

H representing Hermitian Transpose.

11. The gravity search adaptive apparatus of claim 3, wherein the adaptive controller updates the model parameter vector of the system modeling circuit using a gravity search adaptive algorithm that is expressed as equation 116 below:

$$[\vec{w}[k+1] \;\; \vec{v}[k+1]] = [\vec{w}[k] \;\; \vec{v}[k]]\begin{bmatrix} 1 & 0 \\ \beta & \beta \end{bmatrix} + \vec{g}[k][1 \;\; 1] \tag{116}$$

where w represents the model parameter vector of the system modeling circuit, v represents a change velocity of w, $$\beta = 1 - \frac{f}{m},$$

m represents a mass of the ball, f represents a friction coefficient of the liquid, g represents gravitational acceleration, and g[k] is defined as equation 117 below $$\vec{g}[k] = \frac{2g}{1 + 4e[k]\vec{x}[k]^H \vec{x}[k]e^*[k]} \vec{x}[k]e^*[k], \tag{117}$$

where e[k] represents the error signal and H represents Hermitian Transpose.

12. The gravity search adaptive apparatus of claim 11, wherein the adaptive controller applies equation 118 to equation 117, thus obtaining equations 119 and 120 below:

$$g[k] = \tilde{g}|e[k]|^2 \tag{118}$$

$$[\vec{w}[k+1] \;\; \vec{v}[k+1]] = [\vec{w}[k] \;\; \vec{v}[k]]\begin{bmatrix} 1 & 0 \\ \beta & \beta \end{bmatrix} + \vec{g}[k][1 \;\; 1] \tag{119}$$

$$\vec{g}[k] = \frac{2\tilde{g}|e[k]|^2}{1 + 4e[k]\vec{x}[k]^H \vec{x}[k]e^*[k]} \vec{x}[k]e^*[k]. \tag{120}$$

13. The gravity search adaptive apparatus of claim 12, wherein if β is zero, the adaptive controller defines equations 119 and 120 by equation 121 below:

$$\vec{w}[k+1] = \vec{w}[k] + \frac{2\tilde{g}|e[k]|^2}{1 + 4e[k]\vec{x}[k]^H \vec{x}[k]e^*[k]} \vec{x}[k]e^*[k]. \tag{121}$$

14. The gravity search adaptive apparatus of claim 12, wherein when equations 122 and 123 are satisfied, the adaptive controller defines the equation 120 by equation 124, and obtains an algorithm defined as equations 125 and 126 from the equation 124:

$$1 \ll 4e[k]\vec{x}[k]^H \vec{x}[k]e^*[k], \tag{122}$$

$$4\delta|e[k]|^2 \ll 4e[k]\vec{x}[k]^H \vec{x}[k]e^*[k], \tag{123}$$

$$\vec{g}[k] = \frac{2\tilde{g}|e[k]|^2}{4\delta|e[k]|^2 + 4e[k]\vec{x}[k]^H \vec{x}[k]e^*[k]} \vec{x}[k]e[k], \tag{124}$$

$$[\vec{w}[k+1] \;\; \vec{v}[k+1]] = [\vec{w}[k] \;\; \vec{v}[k]]\begin{bmatrix} 1 & 0 \\ \beta & \beta \end{bmatrix} + \vec{g}[k][1 \;\; 1], \tag{125}$$

and $$\vec{g}[k] = \frac{\tilde{\mu}}{\delta + \vec{x}[k]^H \vec{x}[k]} \vec{x}[k]e^*[k]. \tag{126}$$

where $$\delta = \frac{1}{4|e[k]|^2}.$$

15. A method comprising:
calculating, by an adaptive controller using a gravity search adaptive algorithm for solving a problem of finding a global minimum of a cost function which is in the form of a quadratic function, a model parameter vector of a system modeling circuit corresponding to a minimum power value of an error signal which is a difference between an output signal of a system and an output signal of the system modeling circuit when an input signal is input to the system and the system modeling circuit; and
applying, by the adaptive controller, the model parameter vector to the system modeling circuit,
wherein the calculating further comprises:
calculating a power value ϵ of the error signal that is expressed as follows:

$$\epsilon = \sigma_y^2 - 2pw[k] + \sigma_x^2 w[k]^2,$$

where w[k] is the model parameter vector resulting from k-th iteration of the calculation of the model parameter vector, p is $E\{x[k]y[k]\}$, $\sigma_x^2$ is $E\{x^2[k]\}$, x[k] is the input signal, y[k] is the output signal of the system, $\sigma_y^2$ is $E\{y^2[k]\}$, and $E\{\bullet\}$ represents an ensemble average.

16. The method of claim 15, further comprising:
comparing, by the adaptive controller, the error signal to a previously calculated error signal to determine whether the error signal converges on the minimum power value; and
updating, by the adaptive controller, if the error signal does not converge on the minimum power value, the model parameter vector using the gravity search adaptive algorithm.

17. The method of claim 15, further comprising:
comparing, by the adaptive controller, the error signal to a previously calculated error signal to determine whether the error signal converges on the minimum power value; and
estimating, by the adaptive controller, if the error signal converges on the minimum power value, system characteristics of the system using the calculated model parameter vector.

* * * * *